Dec. 16, 1969 C. R. JAESCHKE ET AL 3,484,536

ENCAPSULATED COMPONENT

Filed Nov. 29, 1967

United States Patent Office 3,484,536
Patented Dec. 16, 1969

3,484,536

ENCAPSULATED COMPONENT

Charles R. Jaeschke and William G. Novacek, Visalia, Calif., assignors to Sprague Electric Company, North Adams, Mass., a corporation of Massachusetts Filed Nov. 29, 1967, Ser. No. 686,565
Int. Cl. H15k *5/00*
U.S. Cl. 174—52 11 Claims

ABSTRACT OF THE DISCLOSURE

A component is encapsulated within insulative material in connection to electrodes of a carrier strip which includes a plurality of electrodes arranged in an electrode pattern with one end of the electrodes joined to a connecting member and the other end connected to the component within the insulative material.

Background of the invention

The present invention relates to encapsulated components and more particularly to encapsulated components having component supporting electrodes which extend from the encapsulation.

In the present stage of the electronic arts, component encapsulation is often a costly time-consuming operation, not suited to automation, which generally requires the handling of a large number of small parts. This operation is further complicated by the fragile leads of the components as well as the large number of different components which must be accommodated.

Moreover in operations where premolded casings are utilized, the construction not only requires the handling of individual assemblies but also requires the centering and spacing of both the component and its leads within the casing.

It is an object of this invention to provide an economical encapsulated component.

It is another object of this invention to provide an electrode carrier strip suitable for automated mounting and encapsulation of components.

It is a further object of this invention to provide an encapsulated component in which an electrode pattern connects to and supports the component and provides uniform extended terminals.

It is a still further object of this invention to provide an encapsulated component having removable test tabs of large area in connection to its extended terminals.

It is a still further object of this invention to provide an encased component in which an electrode carrier assembly is positioned within the case by portions of the premolded unit.

These and other objects of the invention will be apparent from the following description taken in conjunction with the accompanying drawing.

Summary of the invention

Broadly, an encapsulated component constructed in accordance with the invention comprises a carrier strip having a plurality of electrodes arranged in an electrode pattern with one end of the electrodes joined to a connecting member and the other end connected to a component within insulative material.

In one embodiment, the electrodes of the carrier strip are arranged in a plane around the component and include test tabs of large area in connection to terminal portions which extend from the encapsulated unit. The electrodes are arcuately curved around the component and extend from it in spaced parallel relation to provide uniformly spaced terminals and test tabs.

In another modification, the carrier strip provides a plurality of straight, uniformly spaced electrodes which support an overlying component and provides a versatile carrier suitable for many different components and encapsulations.

Description of the preferred embodiment

Figure 1:
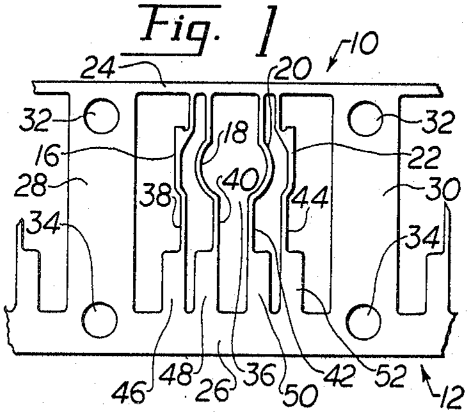
FIGURE 1 is a plan view of a carrier strip providing the electrode pattern of the preferred embodiment.

FIGURE 1 illustrates the first step in construction of an encapsulated component wherein an electrode pattern 10 is repeatedly punched, etched or otherwise formed in a long conductive strip 12. Pattern 10 consists of a web 14 of four conductive struts or ribs 16, 18, 20 and 22 in a coplanar arrangement within a frame provided by top and bottom connecting members 24 and 26 and side members 28 and 30. At the top and bottom of each pattern alignment holes 32 and 34 are included for proper and accurate alignment of the strip 12 throughout the assembly process.

In this embodiment, conductive struts 16, 18, 20 and 22 provide the electrodes of the carrier strip. These are formed around an opening 36 which is designed to accommodate a component. Hence, the electrodes pattern includes a circular configuration around opening 36 with uniformly spaced terminal portions 38, 40, 42 and 44 extended from the circular arrangement. Herein, the innermost electrodes 18 and 20 are arcuately curved around opening 36 while the outermost electrodes 16 and 22 are offset in this area. This provides proper spacing between electrodes and an extended straight length of the outer electrodes for positioning of the carrier in its insulating material. Terminal portions 38, 40, 42 and 44 are joined to connecting member 26 by large area electrode portions 46, 48, 50 and 52 which are employed in testing of the final units.

Figure 2:
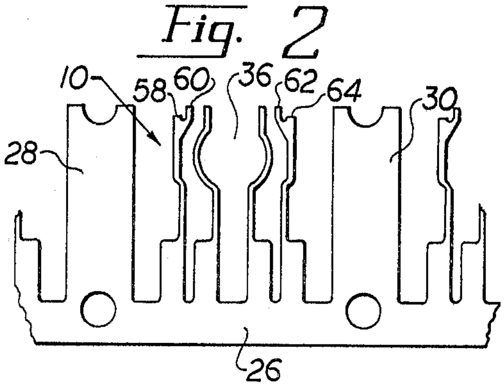
FIGURE 2 is a plan view of the carrier strip illustrating a further step in its construction.

In the next step as shown in FIGURE 2, connecting member 24 is removed from carrier strip 12 by cutting through the top alignment holes 32. This frees the upper ends of the electrodes and permits their use as connecting tabs. In the preferred embodiment, the free electrode ends are then bent through an obtuse angle of about 170° so as to overlay themselves.

Figure 3:
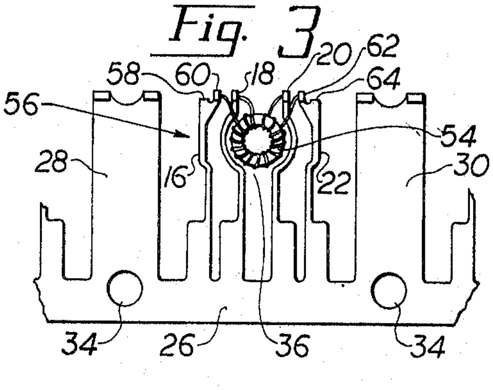
FIGURE 3 is a plan view illustrating the component-carrier assembly.

Thereafter, as shown in FIGURE 3, a component 54, which is a coil in the preferred embodiment, is positioned within opening 36 with its leads passed under the folded tabs and welded or otherwise connected thereto. This provides a component-carrier assembly 56 which may then be sealed within insulative material by any suitable means such as dipping, molding or by sealing within a premolded case. In each case the component and nearby portions of the electrodes are covered with insulative material.

Advantageously, carrier strip 12 may be of any convenient length. For example, it may be maintained as a continuous strip throughout the process, or carrier strips having ten electrode patterns may be cut from the continuous strip of FIGURE 1. The latter provides a convenient length for simultaneous encapsulation of ten units in side by side relation, and is preferred.

For the preferred embodiment, the outer electrodes 16 and 22 of electrode pattern 10 are offset away from the pattern center and are bifuricated at their free end so that each includes a pair of branches or fingers at that end. Hence electrode 16 has an outer branch 58 and an inner branch 60 while electrode 22 has an inner branch 62 and an outer branch 64. This construction allows the inner branches (60 and 62) to be utilized as connecting tabs while the outermost branches (58 and 64) are left unencumbered for use as positioning guides against the side walls of a premolded case and a stop against its rear wall. Consequently, inner electrodes 18 and 20 and branches 60 and 62 provide the connecting tabs of this embodiment.

Since the outer branches 58 and 64 are primarily designed to aid insertion of the component assembly into its case and as a stop, these can be eliminated in some embodiments. For example, outer electrodes 16 and 22 could be offset as shown and include only the inner branch, or these electrodes could be arcuately curved similar to inner electrodes 18 and 20.

In a specific example, strip 12 was made from approximately 1 inch wide .015 inch thick gold plated copper. Pattern 10 was punched to provide an overall electrode pattern width of approximately .530 inch with a center opening of .280 inch. Electrode widths ranged from .015 inch to .025 inch with test tab widths of about .085 inch.

Figure 4:
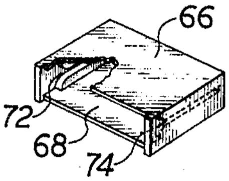
FIGURE 4 is a perspective view of a premolded case employed in the preferred embodiment.

A premolded casing 66 as shown in FIGURE 4 is employed with the component-carrier unit of the preferred embodiment. Case 66 is premolded of any suitable insulative material; for example an organic polymer, such as an epoxy or the like. Advantageously, the premolded case provides precise control of the overall dimensions of the encapsulated unit and a substantially rigid outer shell while permitting the use of a stress reducing inner cushion of insulative material around the component.

Case 66 includes a generally rectangular cavity 68 which is designed to conform to component-carrier assembly 56 of FIGURE 3. Positioning means, in this case horizontal tracks or channels 72 and 74, are carried on the short side walls of cavity 68 for engagement of outer electrodes 16 and 22 to provide for positioning or centering of carrier assembly 56 within the cavity.

As indicated above, channels 72 and 74 are made to engage the outer electrodes. Consequently these provide an opening indentation in the side wall having a thickness slightly greater than that of the electrode. However, the positioning means can be provided in many different ways, for example, by continuous or horizontally aligned protuberances, indentations or other non-planar portions of the cavity walls.

Since the ferrite coil of the preferred embodiment is stress sensitive, a protective low stress material is included within the cavity. Hence the cavity width is somewhat greater than the component thickness to allow room for the protective cushion. However for general use, the cavity width need only be sufficient to accept the component. Cavity length, in this case, is equal to the width of electrode pattern 10, and the latter is kept to a minimum due to the small precisely maintained electrode separation.

Figure 5:
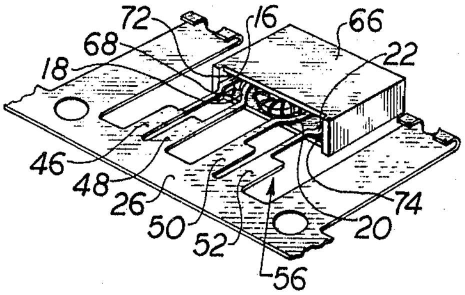
FIGURE 5 is a perspective view illustrating insertion of the electrode-component assembly within the casing of FIGURE 4.

As shown in FIGURE 5, each component-carrier unit 56 is inserted in a separate case 66 with its outer electrodes 16 and 22 engaging channels 72 and 74, respectively. Thereafter, each unit is slid forward into cavity 68 until fingers 58 and 64 strike the cavity rear wall, or other stop. At this time, the free electrode ends engage electrode positioning means of the rear wall, such as vertically aligned channels or projections (illustrated in FIGURE 7) which serve to separate the electrodes; that is, to maintain their original spacing.

Figure 6:
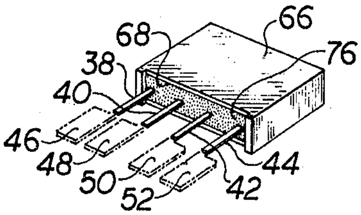
FIGURE 6 is a perspective view of the encapsulated component.

Cavity 68 is then filled or sealed with a suitable insulative material 76 as shown in FIGURE 6. Many insulative materials such as organic polymers or the like will generally be suitable, however as indicated, an insulative material having low stress such as polyurethane is preferred for use with pressure sensitive components. For example, Scotchcast 221 or 222 is suitable in that it provides a coating having high hardness and mechanical strength with low shrinkage and low stress.

Once the cavity has been filled and sealed, the unit is prepared for testing by cutting or severing the supporting frame from the test tabs. Hence connecting member 26 is cut free from test tabs 46, 48, 50 and 52. After testing, the unit is completed by severing or cutting free test tabs 46, 48, 50 and 52 from the electrodes which leaves terminals 38, 40, 42 and 44 extended from the package.

Advantageously, each unit may also remain in connection to its carrier strip for shipping and storage etc., in which case it would be cut free and tested just prior to circuit connection. Alternatively, the unit may be cut from the strip but shipped with its test tabs intact for a conforming test prior to circuit connection.

Figure 7:
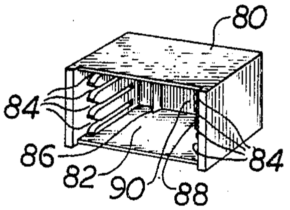
FIGURE 7 is a perspective view of a premolded case designed for multiple component encapsulation.

In an alternative embodiment, a premolded case as shown in FIGURE 7 may be employed for encapsulation of several components in a single unit. Herein, case 80 includes a generally rectangular cavity 82 which includes a plurality of horizontal channels 84 in spaced parallel relation on opposing walls. Each coplanar pair of channels is designed to support a carrier assembly in a manner similar to that described in regard to FIGURE 5. Consequently, the case is designed to incorporate a plurality of component-electrode assemblies arranged in a stacked relationship in parallel planes.

On the rear cavity wall 90, a pair of electrode positioning means 86 and 88 are included for spacing or separation of individual electrodes. Two vertically aligned wall ridges 86 and 88 are illustrated herein but any number of vertical channels or grooves or other non-planar portions of the rear wall, such as short protuberances would be suitable. Consequently while channels 84 provide carrier positioning or vertical centering within the cavity, ridges 86 and 88 provide horizontal positioning or spacing of the electrodes.

Advantageously, case 80 is designed for uniformly spaced encapsulation of a number of units of similar size, however by varying the distance from one coplanar pair of side channels to the next, components of different sizes could be accommodated. Moreover, the spacing projections of the rear wall could also be individually tailored to accommodate variations in the number of leads and their spacings at each level.

Many different embodiments are possible, of course. Any number of electrodes may be employed and various electrode patterns are useful. Moreover, the novel carrier strip could be used with any conventional encapsulation method such as dipping, or molding, or the like.

In addition, many different electrode configurations are also possible. For example, instead of the electrodes lying in a plane around the component, as in the preferred embodiment, a versatile carrier pattern may be provided by substantially straight, uniformly spaced electrodes joined at one end by test tabs to a connecting member. In this embodiment, since side frame members are not included, the number of electrodes selected for each component may be varied as desired. Consequently, the component is first mounted on the electrodes and connected to their free ends. Thereafter, the unit is encapsulated by dipping, coating or molding or the like, or by encasing the unit as in the preferred embodiment. Finally, each encapsulated unit is then cut free from the connecting member etc., as in the preferred embodiment.

Hence, many different modifications may be realized without departing from the spirit and scope hereof, and it is to be understood that the invention is not to be limited except as set forth in the appended claims.

What is claimed is:

1. An encapsulated component comprising a carrier strip, an electronic component, and insulative material, said carrier strip including a plurality of electrodes arranged in a substantially planar electrode pattern with said electrodes joined at one end to a connecting member and connected at the other end to said component, said component and nearby portions of said electrodes enclosed within said insulative material, said electrodes extending from said member to within said material, means for centrally positioning said electrode pattern within said insulative material, and said electrodes spaced alongside said component within said material with said connection being disposed at the inner end of said component.

2. An encapsulated component as claimed in claim 1 wherein said insulative material includes a preformed casing having a cavity therein, said positioning means being provided by non-planar portions of the cavity walls, said component disposed within said cavity in connection therein to said electrodes, at least two of said electrodes engaging said positioning means, and additional insulative material filling and sealing said cavity.

3. An encapsulated component as claimed in claim 2 wherein said additional insulative material provides a low stress cushion adjoining said component and said casing provides an overlying substantially rigid protective shell.

4. An assembly as claimed in claim 2 wherein said electrodes are arranged in a substantially planar electrode pattern with portions of said electrodes alongside said component laterally offset around said component.

5. An encapsulated component as claimed in claim 4 wherein said positioning means are carried on two opposing walls of said cavity and laterally displaced portions of the outermost electrodes of said pattern engage said positioning means and centrally locate said electrode pattern within said cavity.

6. An encapsulated component as claimed in claim 2 wherein said positioning means are carried on a rear wall of said cavity, and the ends of at least two of said electrodes engage said positioning means and are positioned thereby.

7. An encapsulated component as claimed in claim 2 wherein said outermost electrodes are bifuricated and the inner branch of each is connected to said component leaving the outer branch unencumbered for engaging of said carrier positioning means.

8. An assembly as claimed in claim 7 wherein said outer branch also provides an end stop for said electrode pattern.

9. An encapsulated component as claimed in claim 2 wherein a plurality of said carrier positioning means are provided in spaced parallel relationship on two opposing walls of said cavity for positioning a plurality of component-carrier assemblies therein in substantially parallel planes, and including electrode positioning means on the rear wall of said cavity, and at least two of said electrodes engage said positioning means and are positioned thereby.

10. An encapsulated component comprising an electronic component, an electrode pattern having a plurality of electrodes, a preform casing of insulative material, said casing having a cavity therein, said cavity having electrode positioning means at the rear wall thereof, said component disposed within said cavity, said electrodes extended within said cavity and connected to said component therein, at least two of said electrodes engaging said positioning means, and additional insulative material filling and sealing said cavity.

11. An encapsulated component as claimed in claim 10 wherein said casing includes additional positioning means on two opposing walls of said cavity, and the outermost electrodes of said electrode pattern engage said additional positioning means.

References Cited

UNITED STATES PATENTS

| | | | |
|---|---|---|---|
| 2,951,185 | 8/1960 | Buck | 317—101 |
| 3,281,628 | 10/1966 | Bauer et al. | 174 |
| 3,287,795 | 11/1966 | Chambers et al. | 317—101 |

OTHER REFERENCES

IBM Technical Disclosure Bulletin, vol. 8, No. 11, April 1966, pp. 1483-1484, Cochran et al. "Microcircuit Having Pinned Terminals."

LEWIS H. MYERS, Primary Examiner

D. A. TONE, Assistant Examiner

U.S. Cl. X.R.

29—193.5